(12) United States Patent
Kesho et al.

(10) Patent No.: US 9,236,424 B2
(45) Date of Patent: Jan. 12, 2016

(54) FLAT-PANEL DISPLAY DEVICE

(71) Applicant: Japan Display Inc., Minato-ku (JP)

(72) Inventors: Masato Kesho, Tokyo (JP); Kazuhiro Takahashi, Tokyo (JP); Masanobu Nonaka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 18 days.

(21) Appl. No.: 14/231,991

(22) Filed: Apr. 1, 2014

(65) Prior Publication Data

US 2014/0319528 A1    Oct. 30, 2014

(30) Foreign Application Priority Data

Apr. 26, 2013   (JP) ................. 2013-094505

(51) Int. Cl.
| | |
|---|---|
| *H01L 23/498* | (2006.01) |
| *H01L 23/528* | (2006.01) |
| *H01L 23/538* | (2006.01) |
| *H01L 27/32* | (2006.01) |
| *H01L 27/12* | (2006.01) |

(52) U.S. Cl.
CPC ........ *H01L 27/3276* (2013.01); *H01L 27/1244* (2013.01); *H01L 27/3223* (2013.01); *H01L 23/49838* (2013.01); *H01L 23/528* (2013.01); *H01L 23/5386* (2013.01); *H01L 27/124* (2013.01)

(58) Field of Classification Search
CPC ............ H01L 23/49838; H01L 23/528; H01L 23/5386; H01L 27/124; H01L 27/1244; H01L 27/3223; H01L 27/3276
See application file for complete search history.

(56) References Cited

U.S. PATENT DOCUMENTS

| | | | |
|---|---|---|---|
| 5,677,745 A | 10/1997 | Kawano et al. | |
| 2001/0026345 A1* | 10/2001 | Park et al. ................... | 349/149 |
| 2006/0103412 A1 | 5/2006 | Kimura et al. | |
| 2008/0100763 A1* | 5/2008 | Park .............................. | 349/42 |
| 2008/0158466 A1* | 7/2008 | Lee ............................... | 349/54 |
| 2011/0075390 A1* | 3/2011 | Choi et al. .................... | 361/783 |
| 2012/0104394 A1* | 5/2012 | Park .............................. | 257/59 |

FOREIGN PATENT DOCUMENTS

| | | |
|---|---|---|
| JP | 8-234227 | 9/1996 |
| JP | 2006-227290 | 8/2006 |

* cited by examiner

*Primary Examiner* — Eduardo A Rodela
*Assistant Examiner* — Christopher M Roland
(74) *Attorney, Agent, or Firm* — Oblon, McClelland, Maier & Neustadt, L.L.P.

(57) ABSTRACT

According to one embodiment, a flat-panel display device includes a first substrate including an output pad to which a signal necessary for displaying an image on an active area is supplied from a signal supply source, a dummy pad juxtaposed with the output pad, a signal line connected to the output pad, a switching element connected to the signal line, a pixel electrode connected to the switching element in the active area, a first dummy line connected to the dummy pad, spaced apart from the signal line and including a first projection protruding in a direction crossing a direction of extension of the first dummy line, and a second dummy line spaced apart from the dummy pad and the signal line and including a second projection opposed to the first projection.

7 Claims, 5 Drawing Sheets

FLAT-PANEL DISPLAY DEVICE

CROSS-REFERENCE TO RELATED APPLICATIONS

This application is based upon and claims the benefit of priority from Japanese Patent Application No. 2013-094505, filed Apr. 26, 2013, the entire contents of which are incorporated herein by reference.

FIELD

Embodiments described herein relate generally to a flat-panel display device.

BACKGROUND

Flat-panel display devices, such as a liquid crystal display device, are used as display devices in various fields. In the process of manufacturing a flat-panel display device, an antistatic measure is indispensable. For example, there is a concern that static electricity, which has occurred in the manufacturing process, or static electricity, which has entered from the outside, may damage circuits, etc. including various wiring lines and switching elements in an active area.

Various methods have been studied for improving the resistance to such static electricity. For example, in order to discharge an electrostatic charge, there has been proposed a method in which a projection portion is formed on a wiring portion, and a position, where a conductor pattern such as a signal line of another layer is not formed, is selected as the position where the projection portion is to be disposed. In addition, in order to induce discharge of an electric charge accumulated in a common line, which has a relatively large disposition area, there has been proposed a method in which a connection portion for connecting the common line and a counter-electrode is disposed to be opposed, with a predetermined distance, to an inspection line to which a signal for an inspection is supplied at a time of inspecting an effective display part.

DETAILED DESCRIPTION

Figure 1:
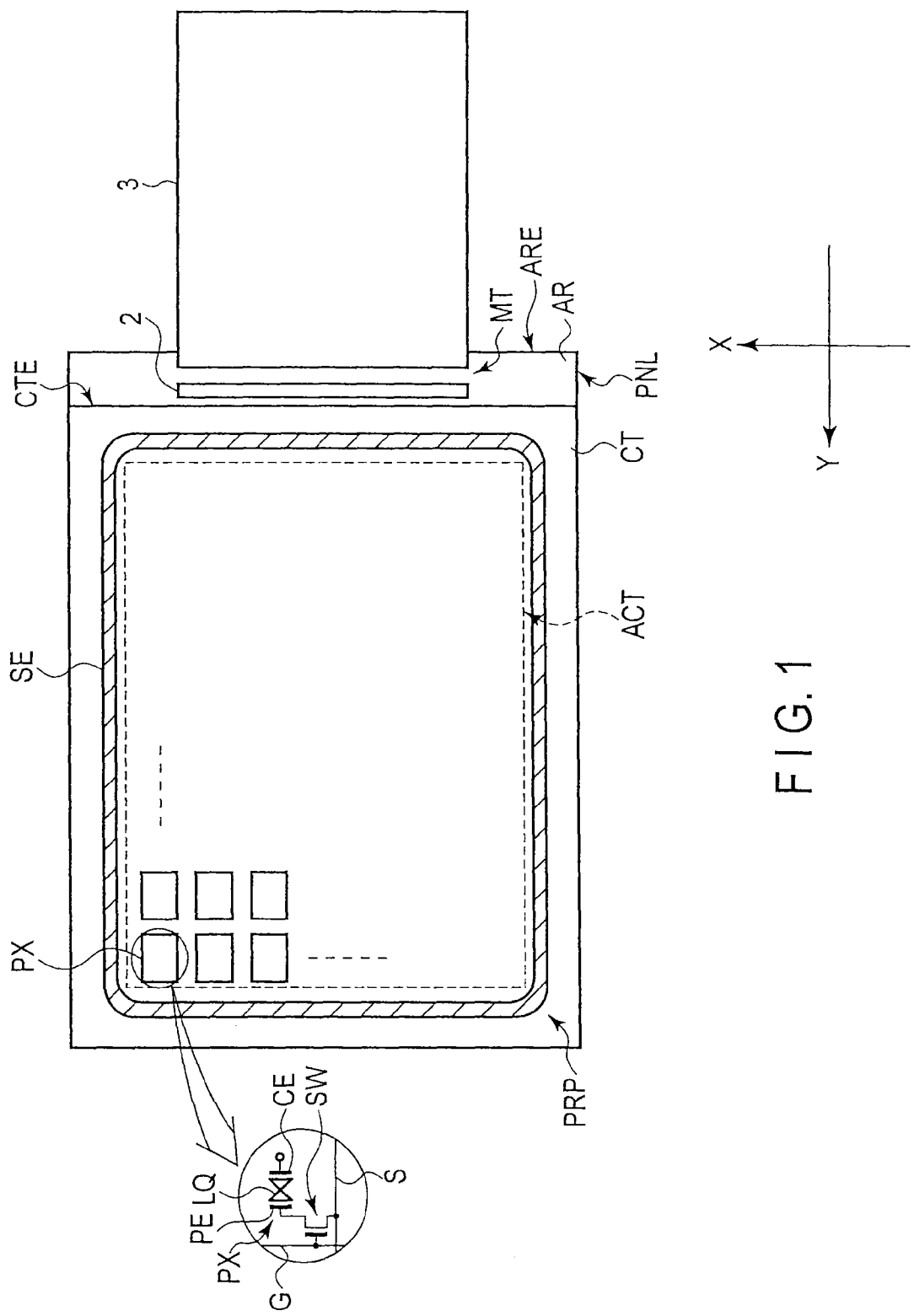
FIG. 1 is a plan view which schematically illustrates an example of a display panel PNL which is applicable to a flat-panel display device according to an embodiment.

In general, according to one embodiment, a flat-panel display device includes: a first substrate including an output pad to which a signal necessary for displaying an image on an active area is supplied from a signal supply source, a dummy pad juxtaposed with the output pad, a signal line connected to the output pad, a switching element connected to the signal line, a pixel electrode connected to the switching element in the active area, a first dummy line connected to the dummy pad, spaced apart from the signal line and including a first projection protruding in a direction crossing a direction of extension of the first dummy line, and a second dummy line spaced apart from the dummy pad and the signal line and including a second projection opposed to the first projection; and a second substrate opposed to the first substrate.

An embodiment will be described hereinafter with reference to the accompanying drawings. In the drawings, structural elements having the same or similar functions are denoted by like reference numerals, and an overlapping description is omitted.

FIG. 1 is a plan view which schematically illustrates an example of a display panel PNL which is applicable to a flat-panel display device according to the embodiment.

Specifically, the display panel PNL is an active-matrix-type liquid crystal display panel, and includes an array substrate AR, a counter-substrate CT which is disposed to be opposed to the array substrate AR, and a liquid crystal layer LQ which is held between the array substrate AR and the counter-substrate CT. The array substrate AR and counter-substrate CT are attached by a sealant SE in a state in which a predetermined cell gap is formed between the array substrate AR and the counter-substrate CT. In the example illustrated, the sealant SE is formed in a closed loop shape like a rectangular frame. Aside from the illustrated example, a liquid crystal filling port may be formed in the sealant SE. The cell gap is formed by columnar spacers (not shown) which are formed on the array substrate AR or counter-substrate CT. The liquid crystal layer LQ is held in an inside surrounded by the sealant SE in the cell gap between the array substrate AR and the counter-substrate CT. The display panel PNL includes an active area ACT, which displays an image, in the inside surrounded by the sealant SE. The active area ACT has, for example, a substantially rectangular shape, and is composed of a plurality of pixels PX which are arrayed in a matrix.

The array substrate AR includes gate lines G extending in a first direction X, source lines S which extend in a second direction Y crossing the first direction X and cross the gate lines G, a switching element SW which is connected to the gate line G and source line S, and a pixel electrode PE which is connected to the switching element SW. In this example, the first direction X is perpendicular to the second direction Y. The gate lines G and source lines S correspond to signal lines, to which signals necessary for displaying an image on the active area ACT are supplied.

A common electrode CE, which is opposed to each pixel electrode PE via the liquid crystal layer LQ, is provided, for example, on the counter-substrate CT, but the common electrode CE may be provided on the array substrate AR.

Although a description of the detailed structure of the display panel PNL is omitted, in a mode which mainly uses a vertical electric field, such as a TN (Twisted Nematic) mode, an OCB (Optically Compensated Bend) mode or a VA (Vertical Aligned) mode, the pixel electrode PE is provided on the array substrate AR, while the common electrode CE is provided on the counter-substrate CT. In addition, in a mode which mainly uses a lateral electric field, such as an IPS (In-Plane Switching) mode or an FFS (Fringe Field Switching) mode, both the pixel electrode PE and counter-electrode CE are provided on the array substrate AR.

A driving IC chip 2 and a flexible printed circuit (FPC) board 3 are mounted, for example, on a peripheral area PRP on the outside of the active area ACT. In the example illustrated, the driving IC chip 2 and FPC board 3 are mounted on a mounting portion MT of the array substrate AR, which extends outward from a substrate end portion CTE of the counter-substrate CT. To be more specific, the driving IC chip 2 is located on the substrate end portion CTE side, and the FPC board 3 is located more on a substrate end portion ARE side of the array substrate AR, than the driving IC chip 2. The driving IC chip 2 and FPC board 3 correspond to signal supply sources which supply signals that are necessary for displaying an image on the active area ACT of the display panel PNL.

The respective gate lines G and source lines S are led out from the active area ACT to the peripheral area PRP, and are connected to the driving IC chip 2, etc. A pixel potential is written in the pixel electrode PE via the switching element SW. The common electrode CE is set at a predetermined potential, for example, a common potential, which is supplied from a power supply line (not shown).

The peripheral area PRP is an area surrounding the active area ACT, includes an area where the sealant SE is disposed, and is formed in a rectangular frame shape.

Figure 2:
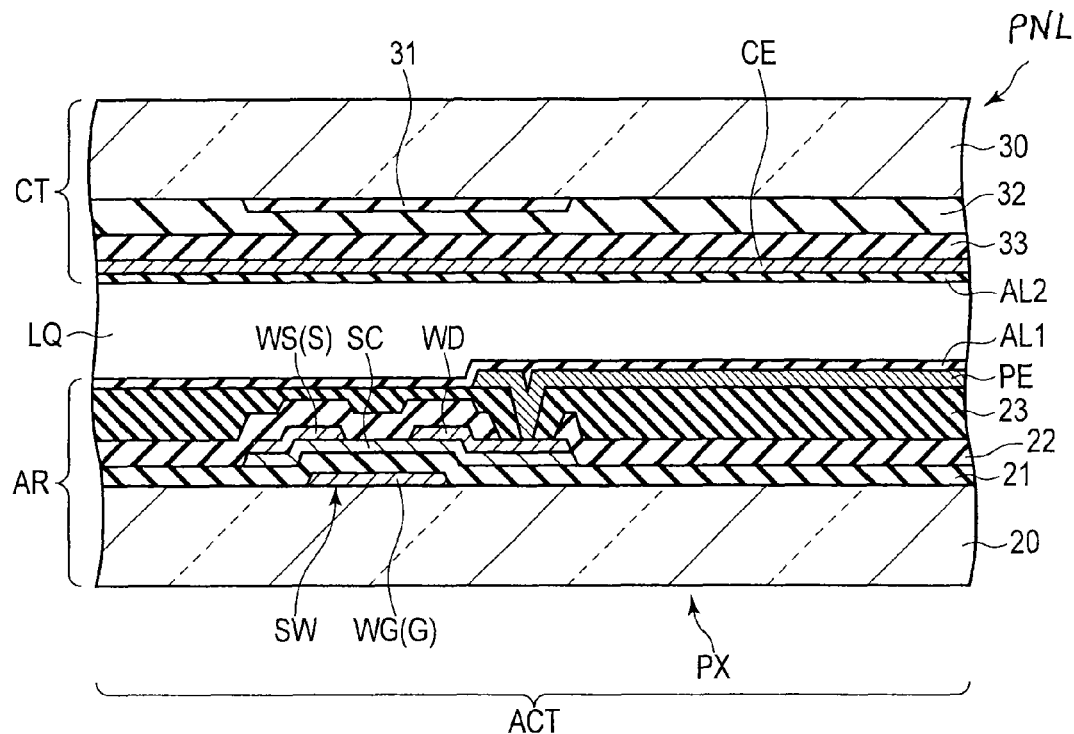
FIG. 2 is a view which schematically illustrates a cross-sectional structure of one pixel PX of the display panel PNL shown in FIG. 1.

FIG. 2 is a view which schematically illustrates a cross-sectional structure of one pixel PX of the display panel PNL shown in FIG. 1. A description is mainly given of the structure to which the mode mainly using the vertical electric field is applied.

Specifically, the array substrate AR is formed by using a transparent first insulative substrate 20 such as a glass substrate or a plastic substrate. The array substrate AR includes a switching element SW, a pixel electrode PE, a first insulation film 21, a second insulation film 22, a third insulation film 23, and a first alignment film AL1, on that side of the first insulative substrate 20, which faces the counter-substrate CT.

In the example illustrated, the switching element SW is composed of a bottom-gate-type n-channel thin-film transistor (TFT). A gate electrode WG of the switching element SW, together with a gate line G, is formed on the first insulative substrate 20. The gate electrode WG is electrically connected to the gate line G. In the example illustrated, the gate electrode WG is formed integral with the gate line G. The gate electrode WG, together with the gate line G, is covered with the first insulation film 21. The first insulation film 21 is also disposed on the first insulative substrate 20.

A semiconductor layer SC of the switching element SW is formed of, for example, amorphous silicon. The semiconductor layer SC is formed on the first insulation film 21, and extends above the gate electrode WG. A source electrode WS and a drain electrode WD of the switching element SW, together with a source line S, are formed on the first insulation film 21. Each of the source electrode WS and drain electrode WD is put in contact with the semiconductor layer SC. The source electrode WS is electrically connected to the source line S. In the example illustrated, the source electrode WS is formed integral with the source line S. The source electrode WS and drain electrode WD, together with the source line S, are covered with the second insulation film 22. The second insulation film 22 is also disposed on the first insulation film 21. The first insulation film 21 and second insulation film 22 are formed of, for example, an inorganic material such as silicon nitride (SiN) or silicon oxide (SiO). The second insulation film 22 and switching element SW are covered with the third insulation film 23. The third insulation film 23 is formed of, for example, a transparent resin material.

The pixel electrode PE is formed on the third insulation film 23. The pixel electrode PE is connected to the drain electrode WD via a contact hole which penetrates the third insulation film 23. The pixel electrode PE is formed of, for example, a transparent, electrically conductive material such as indium tin oxide (ITO) or indium zinc oxide (IZO). The pixel electrode PE and third insulation film 23 are covered with the first alignment film AL1.

The counter-substrate CT is formed by using a second insulative substrate 30 having light transmissivity, such as a glass substrate or a plastic substrate. The counter-substrate CT includes a light shield layer 31, a color filter layer 32, an overcoat layer 33, a common electrode CE, and a second alignment film AL2, on that side of the second insulative substrate 30, which faces the array substrate AR.

The light shield layer 31 is formed to partition the pixels PX in the active area ACT, and is opposed to various wiring portions such as the switching elements SW, gate lines G and source lines S formed on the array substrate AR. The light shield layer 31 is formed of, for example, a light-blocking metallic material such as a black-colored resin material or chromium.

The color filter layer 32 is disposed on the respective pixels PX partitioned by the light shield layer 31 in the active area ACT. A part of the color filter layer 32 is laid over the light shield layer 31. The color filter layer 32 includes a red color filter, a green color filter and a blue color filter, which are formed of resin materials which are colored in red, green and blue, respectively.

The overcoat layer 33 covers the color filter layer 32. The overcoat layer 33 is formed of, for example, a transparent resin material.

The common electrode CE is formed, in the active area ACT, on that side of the overcoat layer 33, which is opposed to the array substrate AR. In the example illustrated, the common electrode CE is opposed to the pixel electrode PE of each pixel PX via the liquid crystal layer LQ. The common electrode CE is formed of, for example, a transparent, electrically conductive material such as ITO or IZO. The common electrode CE is covered with the second alignment film AL2.

The above-described array substrate AR and counter-substrate CT are disposed such that the first alignment film AL1 and second alignment film AL2 face each other. In this case, spacers (e.g. columnar spacers which are formed of resin material so as to be integral with one of the substrates), which are not shown, are disposed between the array substrate AR and counter-substrate CT, and thereby a predetermined cell gap is created. The liquid crystal layer LQ is held in the above-described cell gap. Specifically, the liquid crystal layer LQ is composed of a liquid crystal composition lying between the array substrate AR and the counter-substrate CT.

Figure 3:
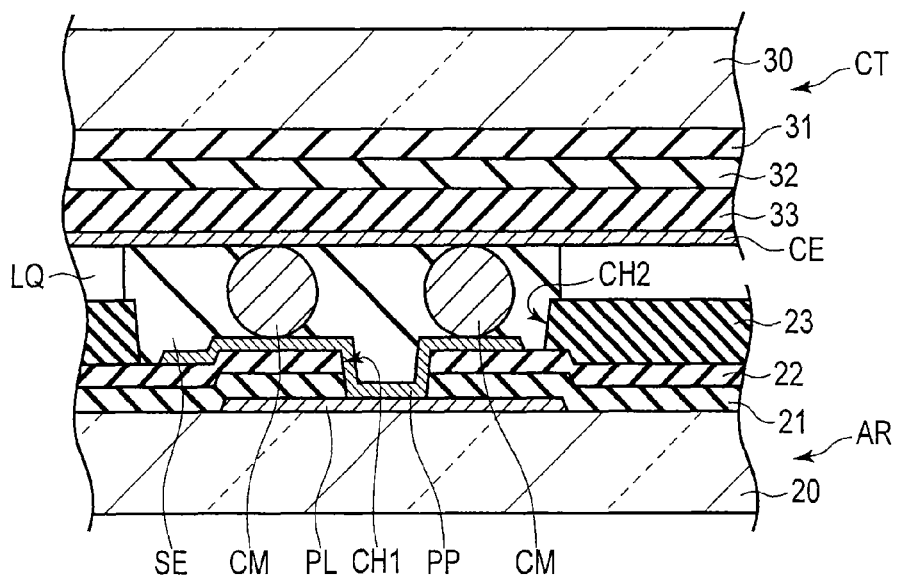
FIG. 3 is a schematic cross-sectional view for describing a power supply structure of power supply from an array substrate AR to a counter substrate CT side.

FIG. 3 is a schematic cross-sectional view for describing a power supply structure of power supply from the array substrate AR to the counter substrate CT side. A description is given of the configuration of the peripheral area PRP where the sealant SE is disposed.

A power line PL is formed on the first insulative substrate 20. Although not described in detail, the power line PL is disposed, for example, along an outermost periphery of the array substrate AR in a manner to surround the active area ACT. The power line PL is formed of the same wiring material as the above-described gate line G, etc. The power line PL is covered with the first insulation film 21. A contact hole CH1, which penetrates to the power line PL, is formed in the first insulation film 21 and second insulation film 22.

A power pad PP is formed at a position of the array substrate AR, which is opposed to the counter-substrate CT, and is electrically connected to the power line PL. The power pad PP is electrically connected to the common electrode CE. Specifically, the power pad PP is formed on the second insulation film 22 which is exposed from a contact hole CH2 that is formed in the third insulation film 23, and is put in contact with the power line PL via the contact hole CH1. The power pad PP is formed of the same electrically conductive material as the above-described pixel electrode PE.

The common electrode CE extends to the peripheral area PRP. Specifically, the common electrode CE extends not only over the active area ACT, but also extends to a position facing the power pad PP beyond a position at which the sealant SE is disposed.

The sealant SE extends over the power pad PP, includes conductive particles CM, and attaches the array substrate AR and the counter-substrate CT. The conductive particles CM are spherical particles with a relatively low resistance, and are, for instance, metallic particles. The conductive particles CM, which are located on the power pad PP, are in contact with the common electrode CE, and electrically connect the power pad PP and the common electrode CE. Thereby, a voltage, which is applied to the power line PL, is supplied to the common electrode CE via the power pad PP and conductive particles CM.

Figure 4:
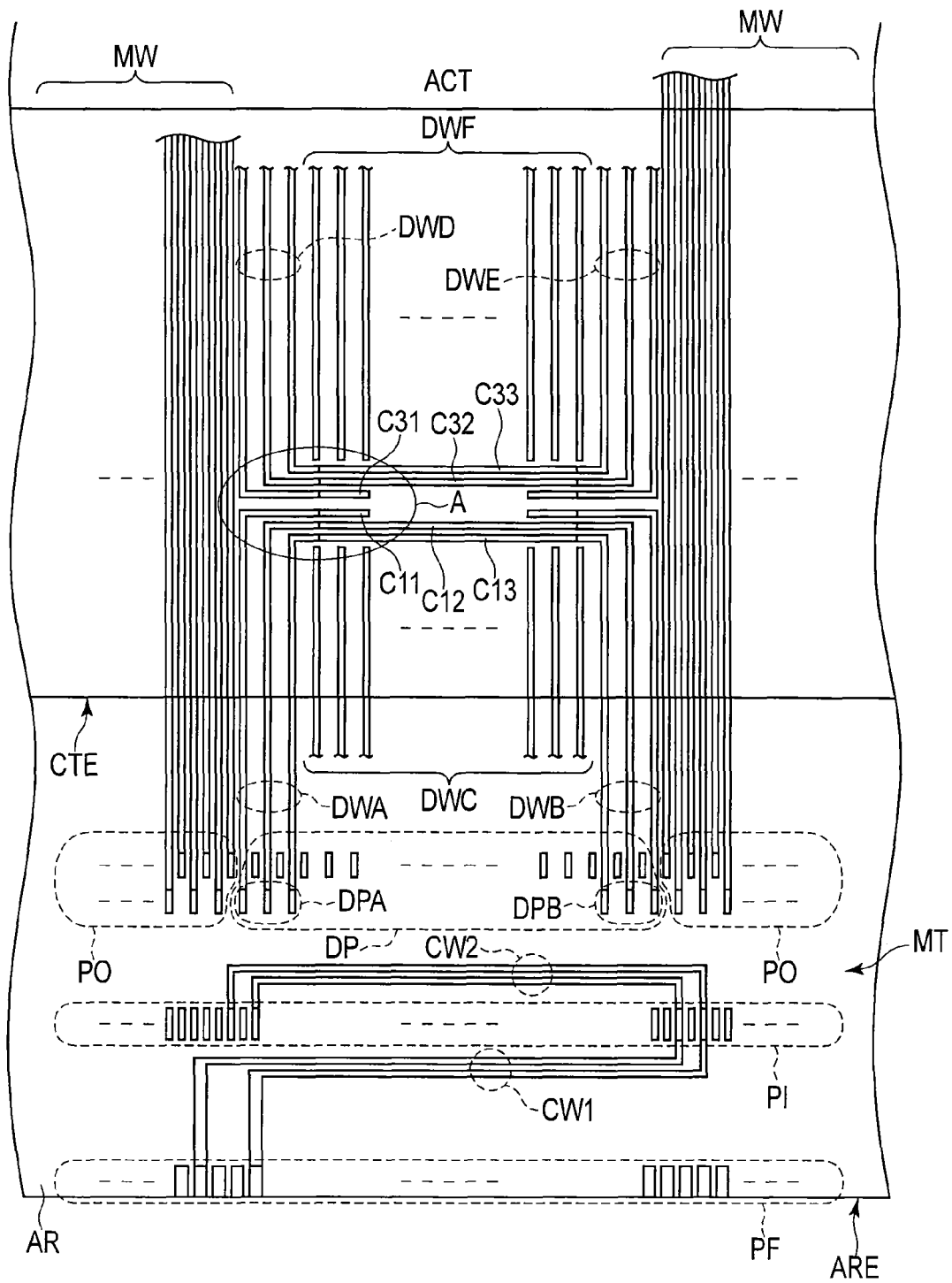
FIG. 4 is a plan view illustrating, in enlarged scale, a part of a mounting portion MT of the array substrate AR shown in FIG. 1.

FIG. 4 is a plan view illustrating, in enlarged scale, a part of the mounting portion MT of the array substrate AR shown in FIG. 1. The illustrated example shows the mounting portion MT in a state before the driving IC chip 2 and FPC board 3 are mounted.

Pads PF for mounting the FPC board, input pads PI for mounting the driving IC chip, output pads PO and dummy pads DP are formed on the mounting portion MT between the substrate end portion ARE and the substrate end portion CTE. The pads PF are arranged along the first direction X in the vicinity of the substrate end portion ARE. The input pads PI are arranged along the first direction X. The output pads PO are arranged along the first direction X. The dummy pads DP are arranged along the first direction X, and are juxtaposed with the output pads PO. In the example illustrated, the output pads PO and dummy pads DP are arranged in two rows along the first direction X, and are arranged in a staggered fashion.

The pads PF are connected to the input pads PI via connection lines CW1. The input pads, for example, input pads PI which are connected to pad PF, and input pads PI which are not connected to pads PF, are connected via connection lines CW2. The connection lines CW2 extend between the input pads PI and output pads PO.

The output pads PO are connected to signal lines MW such as gate lines and source lines. The dummy pads DP are formed at a location where the arrangement of output pads PO is discontinuous, and none of the dummy pads DP are connected to the signal lines MW. In the example illustrated, three dummy pads DPA, which neighbor the left-side output pads PO, are connected to dummy lines DWA which are in a floating state, and three dummy pads DPB, which neighbor the right-side output pads PO, are connected to dummy lines DWB which are in a floating state. Specifically, the dummy lines DWA and dummy lines DWB are all spaced apart from the signal lines MW. Dummy lines DWC in a floating state are formed between the dummy lines DWA and the dummy lines DWB. The dummy lines DWC are spaced apart from the dummy pads DP and signal lines MW. In the meantime, the other dummy pads DP, which are located between the dummy pads DPA and the dummy pads DPB, are connected to none of the signal lines and dummy lines.

Dummy lines DWD in a floating state are further formed on the active area ACT side of the dummy lines DWA. Dummy lines DWE in a floating state are further formed on the active area ACT side of the dummy lines DWB. Dummy lines DWF in a floating state are further formed on the active area ACT side of the dummy lines DWC.

The signal lines MW, dummy lines DWA, dummy lines DWB, dummy lines DWC, dummy lines DWD, dummy lines DWE and dummy lines DWF extend substantially along the second direction Y.

Although not described in detail, part of the dummy lines DWA are connected to dummy lines DWB via connection electrodes which extend in the first direction X. Similarly, part of the dummy lines DWD are connected to dummy lines DWE via connection electrodes which extend in the first direction X.

Next, a detailed configuration of an area surrounded by a broken line in FIG. 4 is described.

Figure 5:
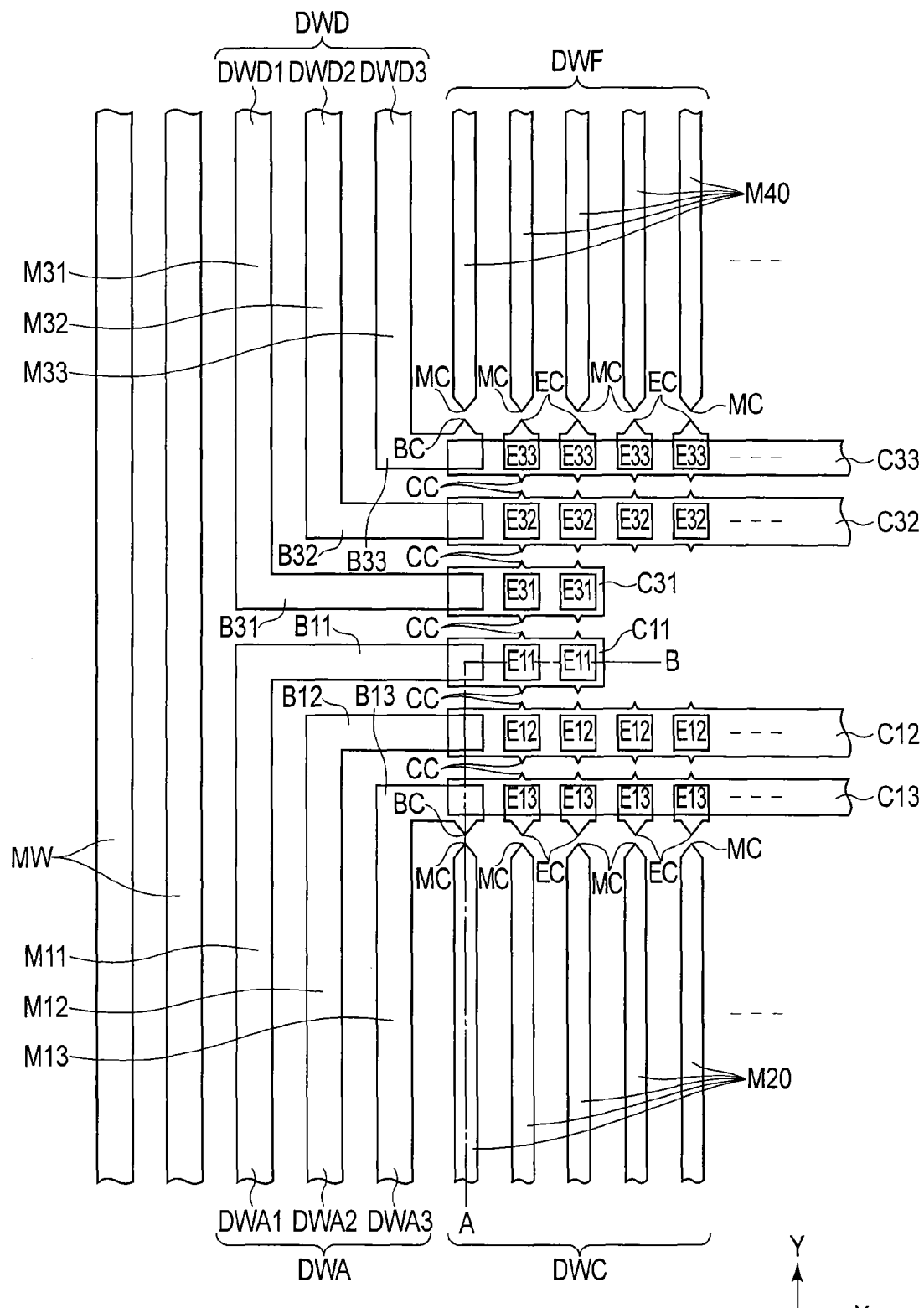
FIG. 5 is a plan view illustrating, in enlarged scale, an area A of the mounting portion MT shown in FIG. 4, the area A being surrounded by an ellipse.

FIG. 5 is a plan view illustrating, in enlarged scale, an area A of the mounting portion MT shown in FIG. 4, the area A being surrounded by an ellipse.

In the example illustrated, as the dummy lines DWA, dummy lines DWA1, DWA2 and DWA3 are arranged in the named order from a position neighboring the signal lines MW. The dummy line DWA1 includes a main portion M11 which extends in parallel to the signal lines MW or extends in the second direction Y, and a bent portion B11 which is formed integral with the main portion M11 and is bent from the main portion M11. The bent portion B11 extends in the first direction X, and is bent at right angles with the main portion M11. Similarly, the dummy line DWA2 includes a main portion M12 which extends in the second direction Y, and a bent portion B12 which is formed integral with the main portion M12, is bent from the main portion M12, and extends in the first direction X. The dummy line DWA3 includes a main portion M13 which extends in the second direction Y, and a bent portion B13 which is formed integral with the main portion M13, is bent from the main portion M13, and extends in the first direction X.

In addition, the dummy line DWA includes an island-shaped electrode and a connection electrode. Specifically, the dummy line DWA1 includes an island-shaped electrode E11 and a connection electrode C11. In the example illustrated, the dummy line DWA1 includes two island-shaped electrodes E11 which are located on the same straight line as the bent portion B11. Specifically, the two island-shaped electrodes E11 are arranged in the first direction X so as to be discretely present from a distal end portion of the bent portion B11, and are spaced apart from the bent portion B11. The connection electrode C11 is electrically connected to the bent portion B11, extends in the first direction X, is electrically connected to the two island-shaped electrodes E11, and electrically connects the bent portion B11 and each of the island-shaped electrodes E11.

The dummy line DWA2 includes a plurality of island-shaped electrodes E12 which are located on the same straight line as the bent portion B12. Specifically, the respective island-shaped electrodes E12 are arranged in the first direction X so as to be discretely present from a distal end portion of the bent portion B12, and are spaced apart from the bent portion B12. The connection electrode C12 is electrically connected to the bent portion B12, extends in the first direction X, is electrically connected to the plural island-shaped electrodes E12, and electrically connects the bent portion B12 and each of the island-shaped electrodes E12.

The dummy line DWA3 includes a plurality of island-shaped electrodes E13 which are located on the same straight line as the bent portion B13. Specifically, the respective island-shaped electrodes E13 are arranged in the first direction X so as to be discretely present from a distal end portion of the bent portion B13, and are spaced apart from the bent portion B13. The connection electrode C13 is electrically connected to the bent portion B13, extends in the first direction X, is electrically connected to the plural island-shaped electrodes E13, and electrically connects the bent portion B13 and each of the island-shaped electrodes E13.

As illustrated in FIG. 4, the connection electrode C12 and connection electrode C13 are also electrically connected to dummy lines DWB which are located on the side opposite to the dummy lines DWA, with the dummy lines DWC being interposed. Specifically, the connection electrode C12 and connection electrode C13 electrically connect part of the dummy lines DWA and part of the dummy lines DWC.

A plurality of dummy lines DWC are successively arranged in the first direction X from a position neighboring the dummy line DWA3. Each dummy line DWC includes a main portion M20 which extends in parallel to the signal lines MW or main portion M13 or extends in the second direction Y. Of the dummy lines DWC, the dummy line which is closest to the dummy line DWA3 is opposed to the bent portion B13, and the other dummy lines are opposed to the island-shaped electrodes E13.

In the above-described configuration, the dummy line DWA includes a projection which protrudes in a direction crossing the direction of extension of the dummy line DWA. In addition, the dummy line DWC includes a projection which is opposed to the projection of the dummy line DWA. These will now be described concretely with reference to the example illustrated.

The dummy line DWA3 includes, at a distal end of the bent portion B13 thereof, a projection BC protruding in the second direction Y toward the dummy line DWC. In addition, the dummy line DWA3 includes, at the respective island-shaped electrodes E13, projections EC protruding in the second direction toward the dummy lines DWC, respectively.

Each of the dummy lines DWC includes, at a distal end of the main portion M20, a projection MC protruding in the second direction Y toward the dummy line DWA. Specifically, of the dummy lines DWC, the dummy line which is closest to the dummy line DWA3 includes, at a distal end thereof, a projection MC which is opposed to the projection BC of the bent portion B13. In addition, the other dummy lines of the dummy lines DWC include, at distal ends thereof, projections MC which are opposed to the projections EC of the respective island-shaped electrodes E13.

On the other hand, the dummy line DWA3 includes, at the connection electrode C13 thereof, projections CC on the side opposite to the projection BC of the bent portion B13 and the projections EC of the island-shaped electrodes E13.

The dummy line DWA2 includes, at the connection electrode C12 thereof, projections CC protruding in the second direction Y perpendicular to the first direction X that is the direction of extension of the connection electrode C12. Specifically, the connection electrode C12 is located between the connection electrode C11 and the connection electrode C13. The edges of the connection electrode C12 extend in the first direction X. The projections CC of the connection electrode C12 protrude toward the connection electrode C11 from one of the edges, and protrude toward the connection electrode C13 from the other edge. Similarly, the dummy line DWA1 includes, at the connection electrode C11 thereof, projections CC protruding in the second direction Y from both edges of the connection electrode C11.

The dummy lines DWD are configured like the dummy lines DWA, and the dummy lines DWF are configured like the dummy lines DWC.

The dummy line DWD1 includes a main portion M31 which extends on the same straight line as the main portion M11, a bent portion B31 which is juxtaposed with the bent portion B11, island-shaped electrodes E31, and a connection electrode C31. The dummy line DWD2 includes a main portion M32 which extends on the same straight line as the main portion M12, a bent portion B32, island-shaped electrodes E32, and a connection electrode C32. The dummy line DWD3 includes a main portion M33 which extends on the same straight line as the main portion M13, a bent portion B33, island-shaped electrodes E33, and a connection electrode C33.

A projection BC, which is opposed to a projection MC formed at a distal end of a main portion M40 of the dummy line DWF, is formed on the bent portion B33. Projections EC, which are opposed to projections MC of main portions M40, are formed on the island-shaped electrodes E33. Projections CC, which are opposed to the connection electrode C32, are formed on the connection electrode C33. Projections CC, which protrude in the second direction Y, are formed on both edges of the connection electrode C32. Projections CC, which protrude in the second direction Y, are formed on both edges of the connection electrode C31. The projections CC, which are formed on one of the edges of the connection electrode C31, are opposed to the projections formed on one of the edges of the neighboring connection electrode C11.

Incidentally, in the example illustrated, each of the projections is formed in a triangular shape so as to have one apex angle, but the shape of the projection is not limited to this example.

Figure 6:
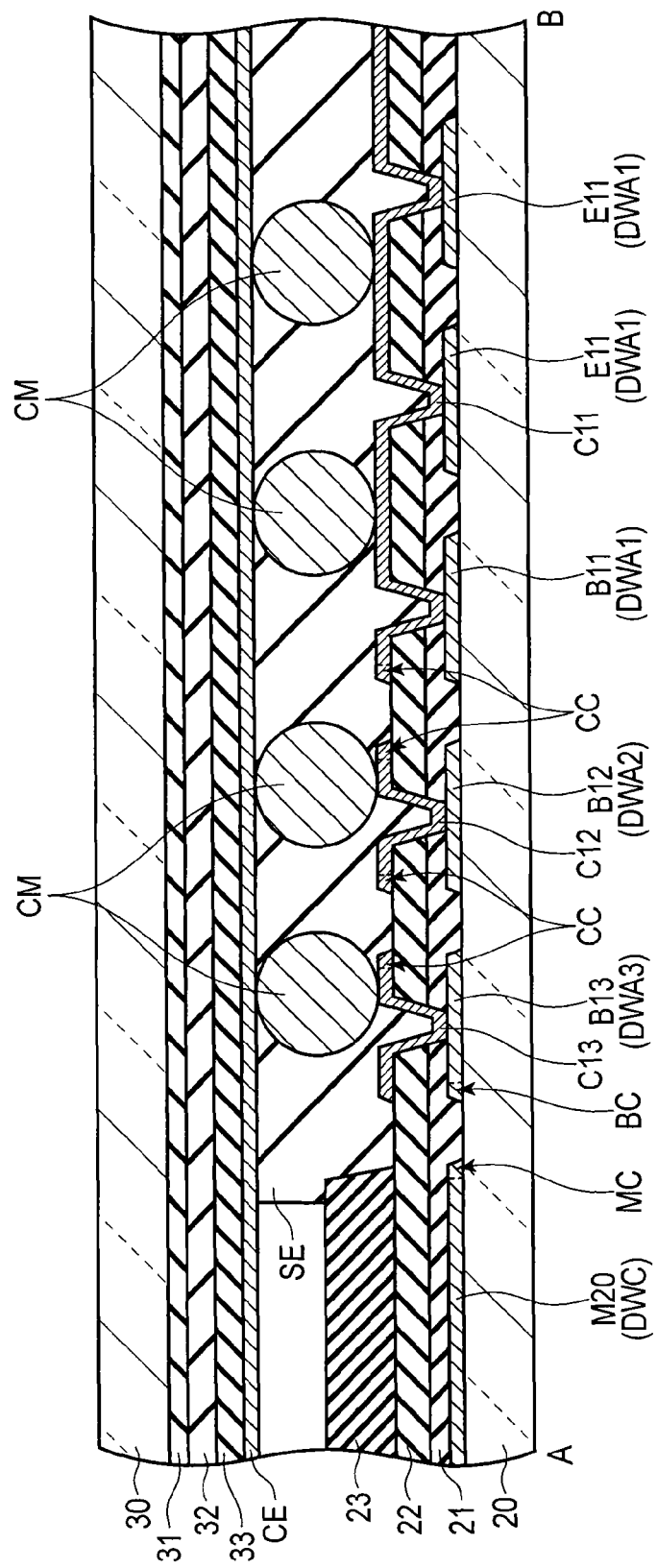
FIG. 6 is a cross-sectional view, taken along line A-B, of the mounting portion MT shown in FIG. 5.

FIG. 6 is a cross-sectional view, taken along line A-B, of the mounting portion MT shown in FIG. 5.

On the insulative substrate 20, there are arranged, in the named order from the left side in FIG. 6, a main portion M20 of the dummy line DWC, a bent portion B13 of the dummy line DWA3, a bent portion B12 of the dummy line DWA2, a bent portion B11 of the dummy line DWA1, and two island-shaped electrodes E11. A projection MC of the main portion M20 is opposed to a projection BC of the bent portion B13 at a distance.

The main portion M20, bent portion B13, bent portion B12, bent portion B11 and island-shaped electrodes E11 are all formed in the same layer as the above-described gate lines, etc., and are formed of the same material as the gate lines, etc.

On the second insulation film 22, a connection electrode C13, a connection electrode C12 and a connection electrode C11 are arranged in the named order from the left side in FIG. 6. The connection electrode C13 is put in contact with the bent portion B13 via a contact hole which penetrates the first insulation film 21, second insulation film 22 and third insulation film 23 to the bent portion B13. Similarly, the connection electrode C12 is put in contact with the bent portion B12 via a contact hole. In addition, the connection electrode C11 is put in contact with the bent portion B11 via a contact hole which penetrates the bent portion B11, and is put in contact with each island-shaped electrode E11 via a contact hole which penetrates to the island-shaped electrode E11. A projection CC of the connection electrode C13 is opposed to a projection CC of the connection electrode C12 at a distance, and a projection CC of the connection electrode C12 is opposed to a projection CC of the connection electrode C11 at a distance.

The connection electrode C11, connection electrode C12 and connection electrode C13 are disposed in an area from which the third insulation film 23 is removed, and are formed of the same material as the pixel electrode. In addition, like the example illustrated in FIG. 3, the sealant SE includes conductive particles CM which are located on the connection electrode C11, connection electrode C12 and connection electrode C13, respectively. The conductive particles CM are in contact with the common electrode CE, and electrically connect each connection electrode and the common electrode CE.

According to the present embodiment, it is possible to suppress breakage of signal lines MW, circuits connected to the signal lines, or switching elements, due to static electricity which enters the pads PF located near the substrate end portion ARE of the array substrate AR, at a stage prior to mounting of the signal supply sources. Specifically, as regards the static electricity entering the pads PF, such a path may possibly be formed that the static electricity reaches the input pads PI via the connection lines CW1 which are located between the pads PF and input pads PI, reaches the output pads PO via the connection lines CW2 which are located between the input pads PI and output pads PO, and then flows in the signal lines MW. In particular, in the part where the output pads PO are made discontinuous, static electricity tends to flow to output pads PO which are located near end portions. There is a concern that such static electricity entering the output pads PO causes short-circuit of neighboring signal lines, or damages various circuits or switching elements, which are connected to the signal lines.

In the present embodiment, the dummy pads DP are disposed at the part where the output pads PO are made discontinuous, and the dummy lines DWA, etc. in a floating state are connected to the dummy pads DP neighboring the output pads PO. In addition, the dummy lines DWC in a floating state are disposed at a position neighboring the dummy lines DWA. While the projections MC are formed on the dummy lines DWC, the projection BC and projections EC are formed on the dummy line DWA. The projections MC are opposed to the projection BC and projections EC, which are formed in the same layer.

Thus, static electricity in a direction from the connection lines CW2 toward the output pads PO can be led to the dummy pads DP. The static electricity entering the dummy pads DP flows through the dummy lines DWA, and can be discharged to the dummy lines DWC via the mutually opposed projections. Specifically, since the static electricity entering the dummy pads DP can be led to the dummy lines DWC which are located on the side opposite to the active area ACT, it becomes possible to suppress the flow of static electricity to the signal lines extending toward the active area ACT.

In addition, the static electricity, which has flowed through the dummy line DWA, flows in the connection electrode with which the dummy line DWA is put in contact via the contact hole, and is partly consumed. Further, the static electricity flows in the island-shaped electrode with which the connection electrode is put in contact via the contact hole, and is partly consumed. Moreover, since the neighboring connection electrodes have mutually opposed projections, the static electricity can be discharged via the projections of the connection electrodes. Therefore, it is possible to promote the consumption of the static electricity entering the array substrate AR, and to suppress short-circuit of signal lines due to the discharge of static electricity, and breakage of various circuits and switching elements.

In the present embodiment, the connection electrode is formed of a transparent electrode of ITO, etc. Since ITO has a high electric resistance, compared to a metallic material used for source lines, etc., there is a concern that static electricity locally concentrates at the connection electrode which is formed of ITO alone, and the static electricity cannot effectively be consumed. However, since the plural island-shaped electrodes, which are discretely disposed in the first direction, are formed by using a metallic material with low electric resistance, the electric resistance of the entirety of the connection electrode can be lowered by putting the connection electrode in contact with these island-shaped electrodes. Specifically, the electric resistance of the connection electrode part can be adjusted by properly putting the connection electrode in contact with the plural island-shaped electrodes which are discretely present. Thereby, compared to the case in which the connection electrode is disposed by ITO alone, the static electricity can effectively be discharged and consumed in the connection electrode part of the embodiment. Therefore, it is possible to suppress short-circuit of signal lines on the array substrate, and breakage of various circuits and switching elements.

Besides, the conductive particles CM included in the sealant SE are in contact with the respective connection electrodes and the common electrode CE, and electrically connect both of them. Thus, the static electricity entering the connection electrodes from the dummy lines DWA is diffused into the common electrode CE via the conductive particles CM. Therefore, the diffusion of static electricity entering the array substrate AR can be suppressed, and it becomes possible to suppress short-circuit of signal lines due to the discharge of static electricity, and breakage of various circuits and switching elements.

Accordingly, a decrease in manufacturing yield can be suppressed.

As has been described above, according to the present embodiment, defects due to static electricity, such as breakage of wiring lines or circuits due to static electricity, can be suppressed. Therefore, a flat-panel display device, which can suppress a decrease in manufacturing yield, can be provided.

In the above-described embodiment, the liquid crystal display device has been described as an example of the flat-panel display device. However, the array substrate AR described in the present embodiment is also applicable to other flat-panel display devices such as an organic electroluminescence display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flat-panel display device comprising:
   a first substrate including an output pad to which a signal necessary for displaying an image on an active area is supplied from a signal supply source, a dummy pad juxtaposed with the output pad, a signal line connected to the output pad, a switching element connected to the signal line, a pixel electrode connected to the switching element in the active area, a first dummy line connected to the dummy pad, spaced apart from the signal line and including a first projection protruding in a direction crossing a direction of extension of the first dummy line, and a second dummy line spaced apart from the dummy pad and the signal line and including a second projection opposed to the first projection; and
   a second substrate opposed to the first substrate,
   wherein the first dummy line includes a first main portion which extends in parallel to the signal line, a first bent portion which is bent from the first main portion, a first island-shaped electrode which is located on the same straight line as the first bent portion and is spaced apart from the first bent portion, and a first connection electrode which is electrically connected to the first bent portion and the first island-shaped electrode, and the first projection is formed on at least one of the first bent portion, the first island-shaped electrode and the first connection electrode.

2. The flat-panel display device of claim 1, wherein the second dummy line includes a second main portion which extends in parallel to the first main portion, and the second projection is formed at a distal end of the second main portion.

3. The flat-panel display device of claim 1, wherein the second dummy line includes a second main portion which extends in parallel to the first main portion, a second bent portion which is bent from the second main portion, a second island-shaped electrode which is located on the same straight line as the second bent portion and is spaced apart from the second bent portion, and a second connection electrode which is electrically connected to the second bent portion and the second island-shaped electrode, and the second projection is formed on at least one of the second bent portion, the second island-shaped electrode and the second connection electrode.

4. The flat-panel display device of claim 1, wherein, in the first dummy line, each of the first bent portion and the first island-shaped electrode includes the first projection, and the first connection electrode includes a third projection on a side opposite to the second projection.

5. The flat-panel display device of claim 1, wherein the first connection electrode is formed of the same material as the pixel electrode.

6. The flat-panel display device of claim 1, wherein the first substrate further includes a power line, and a power pad electrically connected to the power line,
   the second substrate further includes a common electrode which is formed on a side facing the first substrate and extends to a position opposed to the power pad, and
   the flat-panel display device further comprises a sealant which extends over the power pad, is formed in a frame shape surrounding the active area, and attaches the first substrate and the second substrate, the sealant including a conductive particle which electrically connects the power pad and the common electrode.

7. The flat-panel display device of claim 6, wherein the conductive particle is in contact with the first connection electrode.

* * * * *